(12) United States Patent
Vernon et al.

(10) Patent No.: US 10,613,797 B2
(45) Date of Patent: Apr. 7, 2020

(54) STORAGE INFRASTRUCTURE THAT EMPLOYS A LOW COMPLEXITY ENCODER

(71) Applicant: ScaleFlux, Inc., San Jose, CA (US)

(72) Inventors: Mark Vernon, Park City, UT (US); Yang Liu, Milpitas, CA (US); Fei Sun, Irvine, CA (US)

(73) Assignee: SCALEFLUX, INC., San Jose, CA (US)

( * ) Notice: Subject to any disclaimer, the term of this patent is extended or adjusted under 35 U.S.C. 154(b) by 162 days.

(21) Appl. No.: 16/006,170

(22) Filed: Jun. 12, 2018

(65) Prior Publication Data

US 2018/0357014 A1    Dec. 13, 2018

Related U.S. Application Data

(60) Provisional application No. 62/519,170, filed on Jun. 13, 2017.

(51) Int. Cl.
*H03M 7/40* (2006.01)
*G06F 3/06* (2006.01)

(52) U.S. Cl.
CPC .......... *G06F 3/0661* (2013.01); *G06F 3/0608* (2013.01); *G06F 3/0679* (2013.01); *H03M 7/40* (2013.01); *H03M 7/405* (2013.01)

(58) Field of Classification Search
CPC ............ H03M 7/40; H03M 7/42; H03M 7/30; H03M 7/405; G06F 3/0608; G06F 3/0661; G06F 3/0679; G06F 7/483; H04N 19/60; H04N 19/13; H04N 19/14; H04N 19/17; H04N 19/18; H04N 19/42; H04N 19/91

USPC ....................................... 341/59, 65, 67, 106
See application file for complete search history.

(56) References Cited

U.S. PATENT DOCUMENTS

| | | | | | |
|---|---|---|---|---|---|
| 4,646,061 | A | * | 2/1987 | Bledsoe | H03M 7/42 341/107 |
| 5,907,637 | A | * | 5/1999 | Murashita | G06T 9/005 382/232 |
| 6,075,470 | A | * | 6/2000 | Little | H03M 7/3086 341/106 |
| 6,373,412 | B1 | * | 4/2002 | Mitchell | G06T 9/005 341/106 |
| 6,670,897 | B1 | * | 12/2003 | Lin | H03M 7/3084 341/65 |
| 6,961,474 | B1 | * | 11/2005 | Hirano | H04N 19/61 341/67 |
| 8,031,959 | B2 | * | 10/2011 | Chen | H04N 5/44504 382/246 |

(Continued)

*Primary Examiner* — Linh V Nguyen
(74) *Attorney, Agent, or Firm* — Hoffman Warnick LLC

(57) ABSTRACT

A storage infrastructure, method and encoder device for implementing low complexity encoding, The described encoder includes: a preprocessing system that assigns a code length to each unique symbol based on the frequency without performing a sort operation and determines maximum and minimum occurrence frequencies of symbols of each given code length, and the maximum and minimum code length among all the symbols; and a post processing system that cycles through each code length, determines if a maximum occurrence frequency of a current code length, associated with a first symbol, is greater than a minimum occurrence frequency of an adjacent code length, associated with a second symbol, and if greater, swaps code lengths of the first and second symbols.

18 Claims, 5 Drawing Sheets

(56) References Cited

U.S. PATENT DOCUMENTS

| | | | |
|---|---|---|---|
| 8,260,070 B1* | 9/2012 | Rastogi | H04N 19/176 |
| | | | 382/232 |
| 8,406,307 B2* | 3/2013 | Tu | H04N 19/176 |
| | | | 341/67 |
| 8,712,783 B2* | 4/2014 | Mehrotra | G10L 19/032 |
| | | | 341/51 |
| 2010/0189351 A1* | 7/2010 | Mattausch | H03M 7/40 |
| | | | 382/173 |
| 2015/0261990 A1* | 9/2015 | Kim | H03M 7/40 |
| | | | 382/129 |

* cited by examiner

STORAGE INFRASTRUCTURE THAT EMPLOYS A LOW COMPLEXITY ENCODER

TECHNICAL FIELD

The present invention relates to the field of storage and data compression, and particularly to a processing architecture that reduces the implementation complexity of traditional encoders in storage infrastructures.

BACKGROUND

Data compression is being pervasively used in data storage and communication systems to reduce the cost and/or improve speed performance. A large number of data compression algorithms exist today, spanning a wide spectrum on the trade-off between data compression ratio and data processing complexity. Higher data processing complexity tends to cause slower compression/decompression throughput. Entropy coding is a lossless data compression scheme that is one of the most important components in virtually every data compression system, and Huffman coding is the most common entropy coding techniques being used in practice. However, such entropy coding techniques generally utilize sorting or the like that requires serial processing, which can be slow. Given the industry acceptance of entropy coding, it is highly desirable to minimize the implementation complexity of entropy based encoding systems.

SUMMARY

Accordingly, an embodiment of the present disclosure is directed to technologically improving storage systems and associated processes. Embodiments are described that reduce the implementation complexity of entropy encoding by utilizing an architecture that avoids sorting, thus, e.g., allowing for higher speed parallel processing in storing data.

A first aspect provide a storage infrastructure that includes: a flash memory for storing data; and a storage controller for controlling the storage of data based on commands from a host, wherein the storage controller includes a data compression system that utilizes a low complexity encoder, wherein the low complex encoder inputs and compresses a block of raw data and includes: a frequency gathering system to gather a frequency of occurrence for each unique symbol in the raw data; a preprocessing system that assigns a code length to each unique symbol based on the frequency without performing a sort operation and determines maximum and minimum occurrence frequencies of symbols of each given code length, and determines the maximum and minimum code length among all the symbols; a post processing system that cycles through each code length, determines if a maximum occurrence frequency of a current code length, associated with a first symbol, is greater than a minimum occurrence frequency of an adjacent code length, associated with a second symbol, and if greater, swaps code lengths of the first and second symbols; a code table generation system that forms a variable-length code table based on an output of the post processing system; and an encoding system that encodes the raw data using the code table.

A second aspect provides an encoder device, comprising: field programmable gate arrays (FPGAs) for compressing data in a storage infrastructure, wherein the FPGAs are adapted to compress a block of raw data and include: a frequency gathering system to gather a frequency of occurrence for each unique symbol in the raw data; a preprocessing system that assigns a code length to each unique symbol based on the frequency without performing a sort operation and determines maximum and minimum occurrence frequencies of symbols of each given code length, and the maximum and minimum code length among all the symbols; a post processing system that cycles through each code length, determines if a maximum occurrence frequency of a current code length, associated with a first symbol, is greater than a minimum occurrence frequency of an adjacent code length, associated with a second symbol, and if greater, swaps code lengths of the first and second symbols; a code table generation system that forms a variable-length code table based on an output of the post processing system; and an encoding system that encodes the raw data using the code table.

A third aspect provides a method of compressing data within a storage infrastructure, wherein the method comprises: receiving a block of raw data; gathering a frequency of occurrence for each unique symbol in the raw data; assigning a code length to each unique symbol based on the frequency without performing a sort operation; determining maximum and minimum occurrence frequencies of symbols of each given code length; determining maximum and minimum code lengths among all the symbols; cycling through each code length to determine if a maximum occurrence frequency of a current code length, associated with a first symbol, is greater than a minimum occurrence frequency of an adjacent code length, associated with a second symbol, and if greater, swapping code lengths of the first and second symbols; forming a variable-length code table; and encoding the raw data using the code table.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

Figure 1:
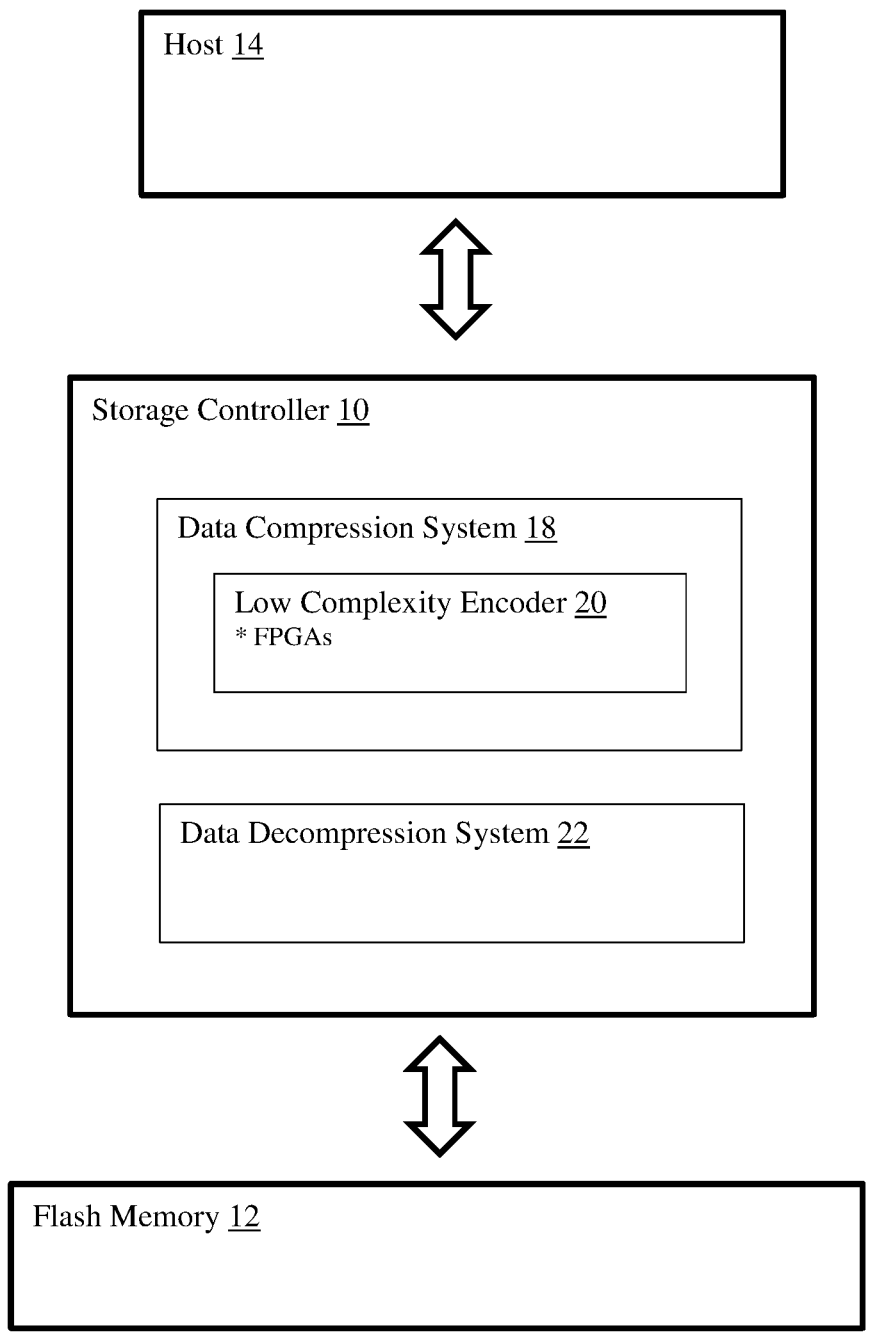
FIG. 1 depicts a storage infrastructure according to an embodiment.

Shown in FIG. 1 is a storage infrastructure that includes a data compression system 18 that utilizes a low complexity encoder 20 for improving storage technology. In this illustrative embodiment, the data compression system 18 is integrated into a storage controller 10 that manages data stored in flash memory 12 based on commands from a host (i.e., CPU) 14. Storage controller 10 and flash memory 12 may for example be implemented as a controller card in which some or all aspects of the data compression system 18. In one illustrative embodiment, the low complexity encoder 20 is implemented as an encoder device using field programmable gate arrays (FPGAs). In other embodiments, the data compression system 18 may be integrated into a network device or be implemented as a standalone device or card connected to a computing infrastructure via an interface such as PCIe.

Figure 2:
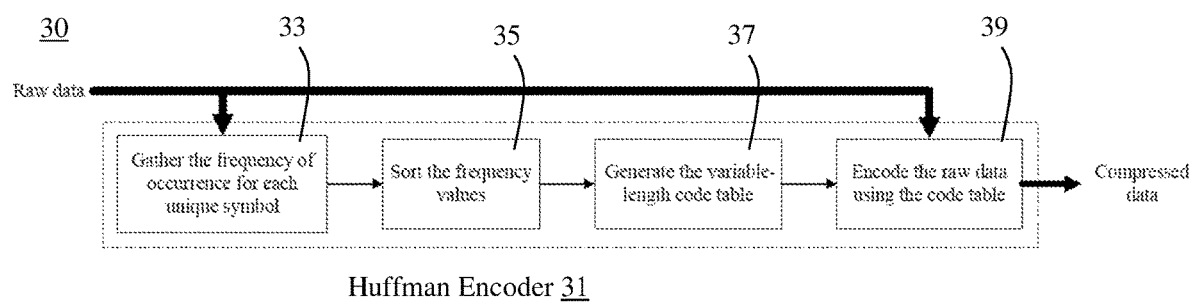
FIG. 2 depicts a traditional Huffman encoding system.

As noted, Huffman coding is one of the most common lossless data compression techniques. An illustrative Huffman encoder 31 is shown in FIG. 2. Given a data block of raw data 30 to be compressed, Huffman encoder 31 generates a variable-length code table for encoding each unique symbol in the data block. The encoder 31 derives this table from the estimated probability or frequency of occurrence for each unique symbol, where more common symbols are represented using fewer bits than less common symbols. As shown in FIG. 2, Huffman encoder 31 generally contains four subsystems: (1) a frequency gathering system 33 to gather the frequency of occurrence for each unique symbol in the raw data, (2) a sorting system 35 to sort the frequency values, (3) a code table generation system 37 to generate a variable-length code table, and (4) an encoding system 39 to encode the raw data using the code table. Among these four subsystems, the sorting system 35 is an inherently serial processing process, which can become an implementation bottleneck in terms of latency and complexity. In particular, the sorting of values cannot be implementing using a parallel processing architecture.

Figure 3:
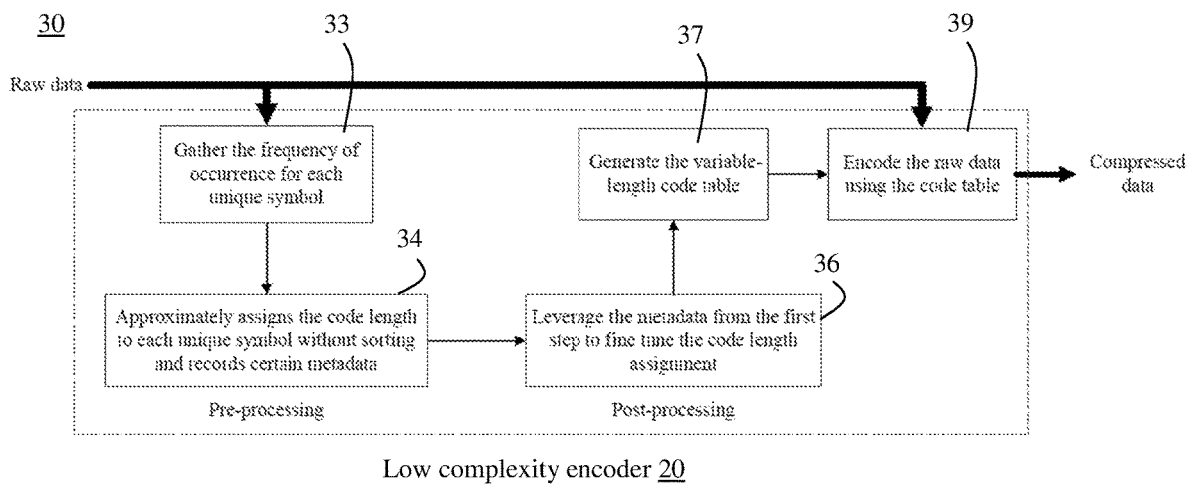
FIG. 3 depicts an entropy encoding system that utilizes a parallel processing architecture according to an embodiment.

To address this issue, a low complexity encoder 20 is provided to obviate the sorting operation in Huffman encoding, which can largely reduce the Huffman encoding implementation complexity. An embodiment is shown in FIG. 3, in which the low complexity encoder 20 replaces the sorting system 35 (FIG. 2) with a two-part system that utilizes: (1) a preprocessing system 34 that assigns a code length to each unique symbol without sorting and determines/records certain metadata (namely, minimum and maximum occurrence frequencies of symbols of each given code length, and the maximum and minimum code length among all the symbols); and (2) a post-processing system 36 that utilizes the metadata from the preprocessing system 34 to fine tune the code length assignments in order to further improve the compression efficiency. Systems 33, 37, and 39 are the same as that employed by the Huffman encoder 31 in FIG. 2.

Figure 4:
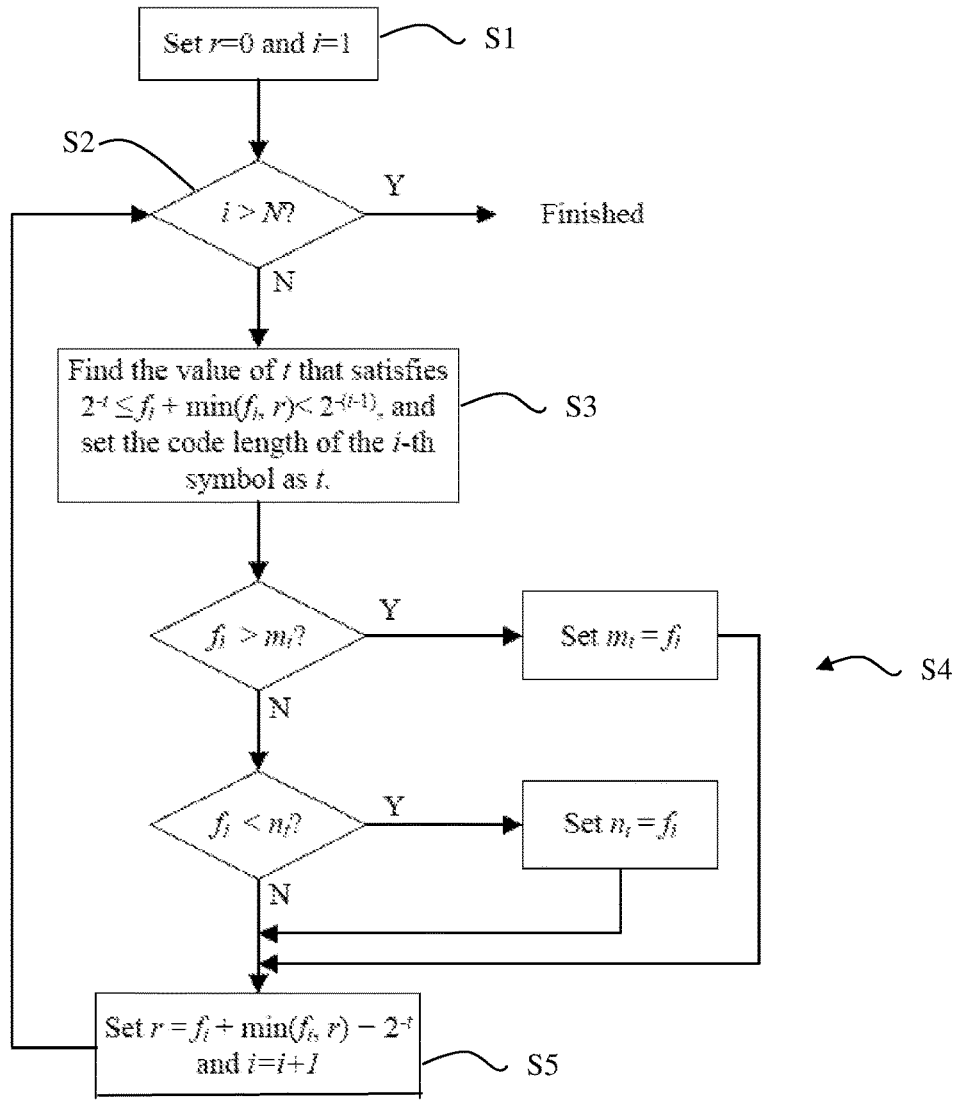
FIG. 4 depicts a flow diagram of a pre-processing phase according to an embodiment.

FIG. 4 shows the operational flow diagram of the preprocessing system 34 of the low complexity encoder 20 depicted in FIG. 3. At S1, variable i is initialized to 1 and variable r is initialized to 0. At S2, a check is made whether i<N, in which N denotes the total number of unique symbols in the raw data 30. For example, if each symbol comprises an 8-bit packet, illustrative symbols S in the raw data 30 might comprise 225 different symbols that include: $S_1=00000000$, $S_2=00000001$, $S_3=00000011$ . . . $S_N=11111100$. Each symbol $S_i$ has an associated frequency $f_i$, as calculated by a frequency gathering system 38 in the low complexity encoder 20. In processes S3-S5, the preprocessing system 34 cycles through and assigns each symbol a code length t without performing a sort. In addition, a maximum and minimum occurrence frequency $m_t$ and $n_t$ of symbols with each different code length t are established. For example, there may be 30 different symbols having a code length of five bits. As is understood, the 30 different symbols may have a range of different frequencies, but share the same code length. Thus, for a given code length t, there will be at least one symbol with a maximum frequency and at least one symbol with a minimum frequency.

At S3, the code length t of the i-th symbol is calculated by finding the value of t that satisfies $2^{-t} \leq f_i + \min(f_i, r) < 2^{-(t-1)}$. For example, assume that r=0 and a particular symbol $S_x$ appears in the block of raw data at a rate of 10%, i.e., $f_x$ is 1/10. The value of t must satisfy $2^{-t} \leq 1/10 + 0 < 2^{-(t-1)}$. A value of t=4 results in 1/16≤1/10<1/8, which satisfies the equation.

Next at S4, a determination is made whether the frequency $f_i$ of the current symbol is greater than the maximum frequency $m_t$ or less than the minimum frequency $n_t$. If the frequency $f_i$ is greater than the previously established maximum frequency $m_t$, then $m_t$ is set to the current frequency $f_i$. Similarly, if the frequency $f_i$ is less than the previously established minimum frequency $n_t$, then $n_t$ is set to the current frequency $f_i$. At S5, the value of r is updated to $r=f_i+\min(f_i, r)-2^{-t}$, and i is incremented to process the next symbol at S2. Using the above example, $r=1/10+0-1/16=3/80$. The process repeats until all N symbols are processed.

Figure 5:
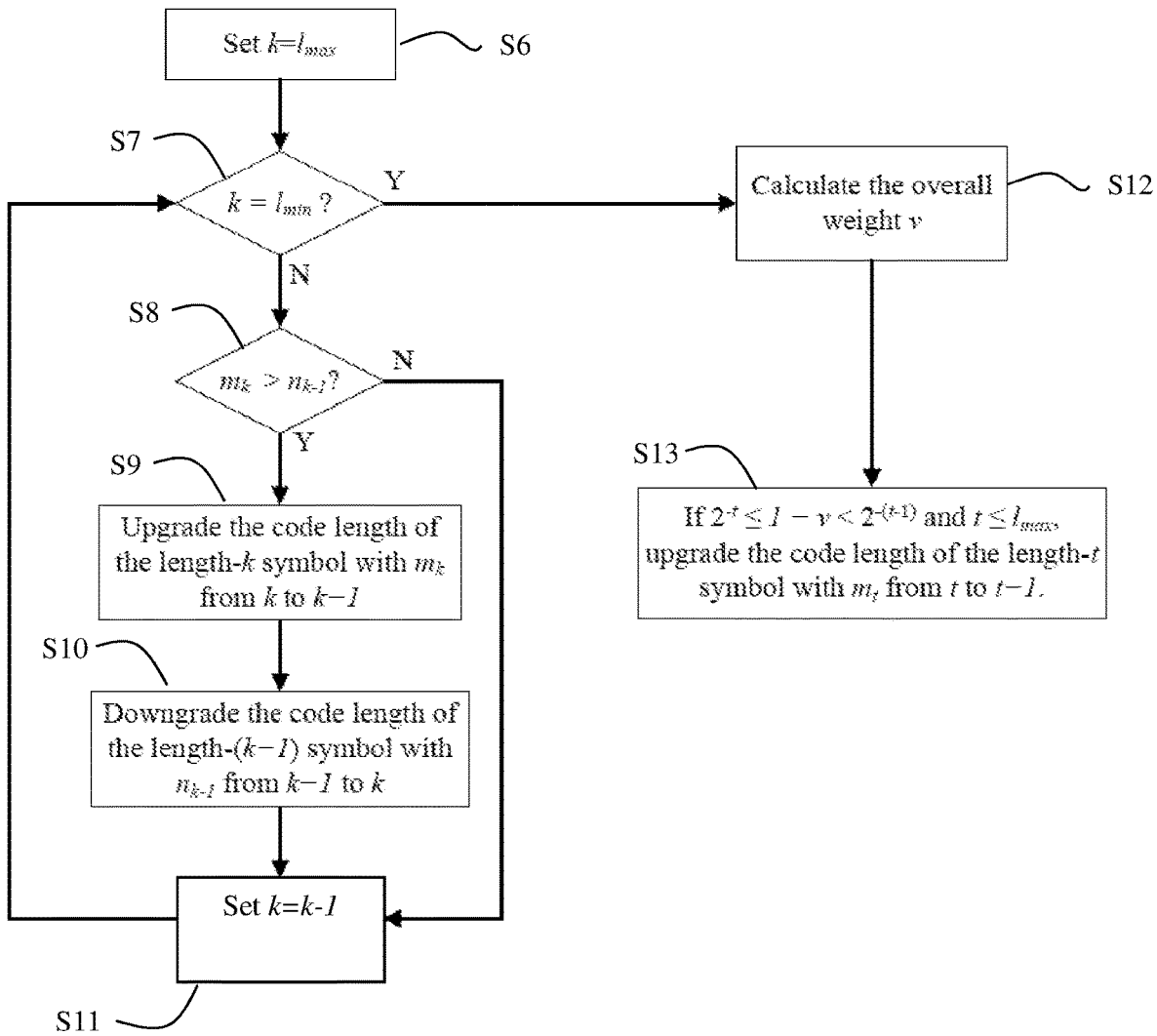
FIG. 5 depicts a flow diagram of a pre-processing phase according to an embodiment.

FIG. 5 shows the operational flow diagram of the post processing system 36 of the low complexity decoder 20. As noted above, the preprocessing system 34 saves metadata that includes (1) minimum and maximum occurrence frequencies of symbols of each given code length, and (2) the maximum and minimum code length among all the symbols. For the embodiment shown in FIG. 5, let $l_{max}$ and $l_{min}$ denote the maximum and minimum code length among all the symbols as determined from the preprocessing system 34. The process begins with the maximum code length $l_{max}$ and cycles down to the minimum code length $l_{min}$.

Initially, a variable k is set to $l_{max}$ at S6, and at S7 a check is made whether $k=l_{min}$, i.e., all code lengths have been processed. If no, then at S8, $m_k$ (i.e., the maximum occurrence frequency of symbols with the code length of k) is compared with $n_{k-1}$ (i.e., the minimum occurrence frequency of symbols with the code length of k–1), is $m_k > n_{k-1}$? For example, if the maximum occurrence frequency of symbols of code length 6 is 1/10 and the minimum occurrence frequency of symbols of code length 5 is 1/12, then a yes would result at S8. When a yes condition is detected, then at S9/S10, the code length for the two symbols are swapped. Namely, at S9 the code length of the length-k symbol with $m_k$ (e.g., length=6) is upgraded (i.e., reduced to a shorter code length) from k to k–1 (e.g., length=5), and at S10 the code length of the length-(k–1) symbol with $n_{k-1}$ (e.g., length=5) is downgraded (i.e., increased to a longer code length) from k–1 to k (e.g., length=6). In other words, the post processing system determines if a maximum occurrence frequency of a current code length (associated with a first symbol) is greater than a minimum occurrence frequency of an adjacent code length (associated with a second symbol) and if greater, swaps code lengths of the first and second symbols.

At S11, k is incremented and the process loops back to S7. Once all of the code lengths have been processed, i.e., yes at S7, then an overall weight v is calculated at S12 for all the symbols. The overall weight v is calculated as $$v = \sum_{i=1}^{N} \frac{1}{2^{l_i}}$$

Next at S13, if $2^{-t} \leq 1-v < 2^{-(t-1)}$ for any $t \leq l_{max}$, the code length of the length-t symbol is upgraded with $m_t$ from t to t–1.

It is understood that the data compression system 18 may be implemented in any manner, e.g., as an integrated circuit board or a controller card that includes a processing core, I/O and processing logic. Aspects of the processing logic may be implemented in hardware or software, or a combination thereof. For example, aspects of the processing logic may be implemented using field programmable gate arrays (FPGAs), ASIC devices, or other hardware-oriented system.

In addition, while generally described as being implemented to improve the technical operations (e.g., lower complexity and high speed) of storage infrastructures, the encoder device described herein could be used in other technologies, such as communications systems in which greater communication speeds can be achieved.

Aspects may be implemented with a computer program product stored on a computer readable storage medium. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, etc. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Python, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by hardware and/or computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The invention claimed is:

1. A storage infrastructure that includes:
   a flash memory for storing data; and
   a storage controller for controlling the storage of data based on commands from a host, wherein the storage controller includes a data compression system that utilizes a low complexity encoder, wherein the low complex encoder inputs and compresses a block of raw data and includes:
   a frequency gathering system to gather a frequency of occurrence for each unique symbol in the raw data;
   a preprocessing system that assigns a code length to each unique symbol based on the frequency without performing a sort operation and determines maximum and minimum occurrence frequencies of symbols of each given code length, and determines the maximum and minimum code length among all the symbols;

a post processing system that cycles through each code length, determines if a maximum occurrence frequency of a current code length, associated with a first symbol, is greater than a minimum occurrence frequency of an adjacent code length, associated with a second symbol, and if greater, swaps code lengths of the first and second symbols;

a code table generation system that forms a variable-length code table based on an output of the post processing system; and an encoding system that encodes the raw data using the code table.

2. The storage infrastructure of claim 1, wherein the preprocessing system assigns the code length t by finding a value of t that satisfies $2^{-t} \leq f_i + \min(f_i, r) < 2^{-(t-1)}$ where $f_i$ is the frequency of occurrence of a current symbol and r is calculated as $r = f_i + \min(f_i, r) - 2^{-t}$.

3. The storage infrastructure of claim 2, wherein the maximum occurrence frequency for symbols of length t is set to $f_i$ if $f_i$ for the current symbol is greater than a previously established maximum occurrence frequency.

4. The storage infrastructure of claim 2, wherein the minimum occurrence frequency for symbols of length t is set to $f_i$ if $f_i$ for the current symbol is less than a previously established minimum occurrence frequency.

5. The storage infrastructure of claim 1, wherein the post processing system:

calculates an overall weight v of all the symbols; and if $2^{-t} \leq 1 - v < 2^{-(t-1)}$ for any $t \leq l_{max}$, the code length of the length-t symbol with $m_t$ is upgraded from t to t−1, where $m_t$ is the maximum occurrence frequency.

6. The storage infrastructure of claim 5, wherein the overall weight v is calculated as $$v = \sum_{i=1}^{N} \frac{1}{2^{l_i}}.$$

7. An encoder device, comprising:

field programmable gate arrays (FPGAs) for compressing data in a storage infrastructure, wherein the FPGAs are adapted to compress a block of raw data and include:

a frequency gathering system to gather the frequency of occurrence for each unique symbol in the raw data;

a preprocessing system that assigns a code length to each unique symbol based on the frequency without performing a sort operation and determines maximum and minimum occurrence frequencies of symbols of each given code length, and the maximum and minimum code length among all the symbols;

a post processing system that cycles through each code length, determines if a maximum occurrence frequency of a current code length, associated with a first symbol, is greater than a minimum occurrence frequency of an adjacent code length, associated with a second symbol, and if greater, swaps code lengths of the first and second symbols;

a code table generation system that forms a variable-length code table based on an output of the post processing system; and an encoding system that encodes the raw data using the code table.

8. The encoder device of claim 7, wherein the preprocessing system assigns the code length t by finding a value of t that satisfies $2^{-t} \leq f_i + \min(f_i, r) < 2^{-(t-1)}$, where $f_i$ is the frequency of occurrence of a current symbol and r is calculated as $r = f_i + \min(f_i, r) - 2^{-t}$.

9. The encoder device of claim 8, wherein the maximum occurrence frequency for symbols of length t is set to $f_i$ if $f_i$ for the current symbol is greater than a previously established maximum occurrence frequency.

10. The encoder device of claim 8, wherein the minimum occurrence frequency for symbols of length t is set to $f_i$ if $f_i$ for the current symbol is less than a previously established minimum occurrence frequency.

11. The encoder device of claim 7, wherein the post processing system:

calculates an overall weight v of all the symbols; and if $2^{-t} \leq 1 - v < 2^{-(t-1)}$ for any $t \leq l_{max}$, the code length of the length-t symbol with $m_t$ is upgraded from t to t−1, where $m_t$ is the maximum occurrence frequency.

12. The encoder device of claim 11, wherein the overall weight v is calculated as $$v = \sum_{i=1}^{N} \frac{1}{2^{l_i}}.$$

13. A method of compressing data within a storage infrastructure, wherein the method comprises:

receiving a block of raw data;

gathering a frequency of occurrence for each unique symbol in the raw data;

assigning a code length to each unique symbol based on the frequency without performing a sort operation;

determining maximum and minimum occurrence frequencies of symbols of each given code length;

determining maximum and minimum code lengths among all the symbols;

cycling through each code length to determine if a maximum occurrence frequency of a current code length, associated with a first symbol, is greater than a minimum occurrence frequency of an adjacent code length, associated with a second symbol, and if greater, swapping code lengths of the first and second symbols;

forming a variable-length code table; and encoding the raw data using the code table.

14. The method of claim 13, wherein the preprocessing system assigns the code length t by finding a value of t that satisfies $2^{-t} \leq f_i + \min(f_i, r) < 2^{-(t-1)}$, where $f_i$ is the frequency of occurrence of a current symbol and r is calculated as $r = f_i + \min(f_i, r) - 2^{-t}$.

15. The method of claim 14, wherein the maximum occurrence frequency for symbols of length t is set to $f_i$ if $f_i$ for the current symbol is greater than a previously established maximum occurrence frequency.

16. The method of claim 14, wherein the minimum occurrence frequency for symbols of length t is set to $f_i$ if $f_i$ for the current symbol is less than a previously established minimum occurrence frequency.

17. The method of claim 13, further comprising:

calculating an overall weight v of all the symbols; and if $2^{-t} \leq 1 - v < 2^{-(t-1)}$ for any $t \leq l_{max}$, the code length of the length-t symbol with $m_t$ is upgraded from t to t−1, where $m_t$ is the maximum occurrence frequency.

18. The method of claim 17, wherein the overall weight v is calculated as $$v = \sum_{i=1}^{N} \frac{1}{2^{l_i}}.$$

* * * * *